United States Patent [19]

Chia et al.

[11] Patent Number: 5,463,529
[45] Date of Patent: Oct. 31, 1995

[54] HIGH POWER DISSIPATING PACKAGES WITH MATCHED HEATSPREADER HEATSINK ASSEMBLIES

[75] Inventors: Chok J. Chia, Campbell; Manian Alagaratnam; Qwai H. Low, both of Cupertino; Seng-Sooi Lim, San Jose, all of Calif.

[73] Assignee: LSI Logic Corporation, Milpitas, Calif.

[21] Appl. No.: 317,968

[22] Filed: Oct. 4, 1994

Related U.S. Application Data

[63] Continuation of Ser. No. 23,981, Feb. 26, 1993, Pat. No. 5,353,193.
[51] Int. Cl.⁶ .................................................. H05K 7/20
[52] U.S. Cl. .................. 361/704; 165/80.3; 165/185; 257/707; 257/713; 257/722; 361/690; 361/717; 361/718
[58] Field of Search .................. 165/80.3, 185; 174/16.3; 257/706, 707, 712, 713, 720, 722, 731–733, 796; 361/688, 690, 704, 707, 709–710, 717–718, 722–723

[56] References Cited

U.S. PATENT DOCUMENTS

| | | | |
|---|---|---|---|
| 3,836,825 | 9/1974 | Hall et al. ............................... | 361/386 |
| 4,345,267 | 8/1982 | Corman et al. ........................ | 361/382 |
| 4,621,304 | 11/1986 | Oogaki et al. ........................ | 361/386 |
| 4,626,960 | 12/1986 | Hamano et al. ...................... | 361/388 |
| 4,712,159 | 12/1987 | Clemens ............................... | 361/386 |
| 4,716,494 | 12/1987 | Bright et al. ......................... | 361/386 |
| 4,729,426 | 3/1988 | Hinshaw .............................. | 165/80.3 |
| 4,897,764 | 1/1990 | Bruchmann et al. ................ | 361/387 |
| 4,978,638 | 12/1990 | Buller et al. ......................... | 437/209 |
| 5,227,663 | 7/1993 | Patil et al. ............................ | 361/386 |

*Primary Examiner*—Gregory D. Thompson
*Attorney, Agent, or Firm*—Poms, Smith, Lande & Rose

[57] ABSTRACT

A removable heatsink assembly comprised of a heatsink unit and a heatspreader is provided. The heatsink unit has at least one fin and a coupling collar for radiating heat away from a packaged electronic device. The heatspreader includes a platform attached to an inner collar in thermal contact with the packaged electronic device. The platform has one or more tabs suitable for mating with one or more flanges located on the coupling collar of the heatsink unit. Coupling grooves within the flanges engage the platform of the heatspreader when the flanges are mated with the heatspreader tabs and the heatsink is turned. The heatsink can therefore be quickly and conveniently attached to or removed from the heatspreader. The present invention thus permits a wide variety of different heatsinks to be interchangeably used with a single heatspreader attached to an electronic device package.

28 Claims, 3 Drawing Sheets

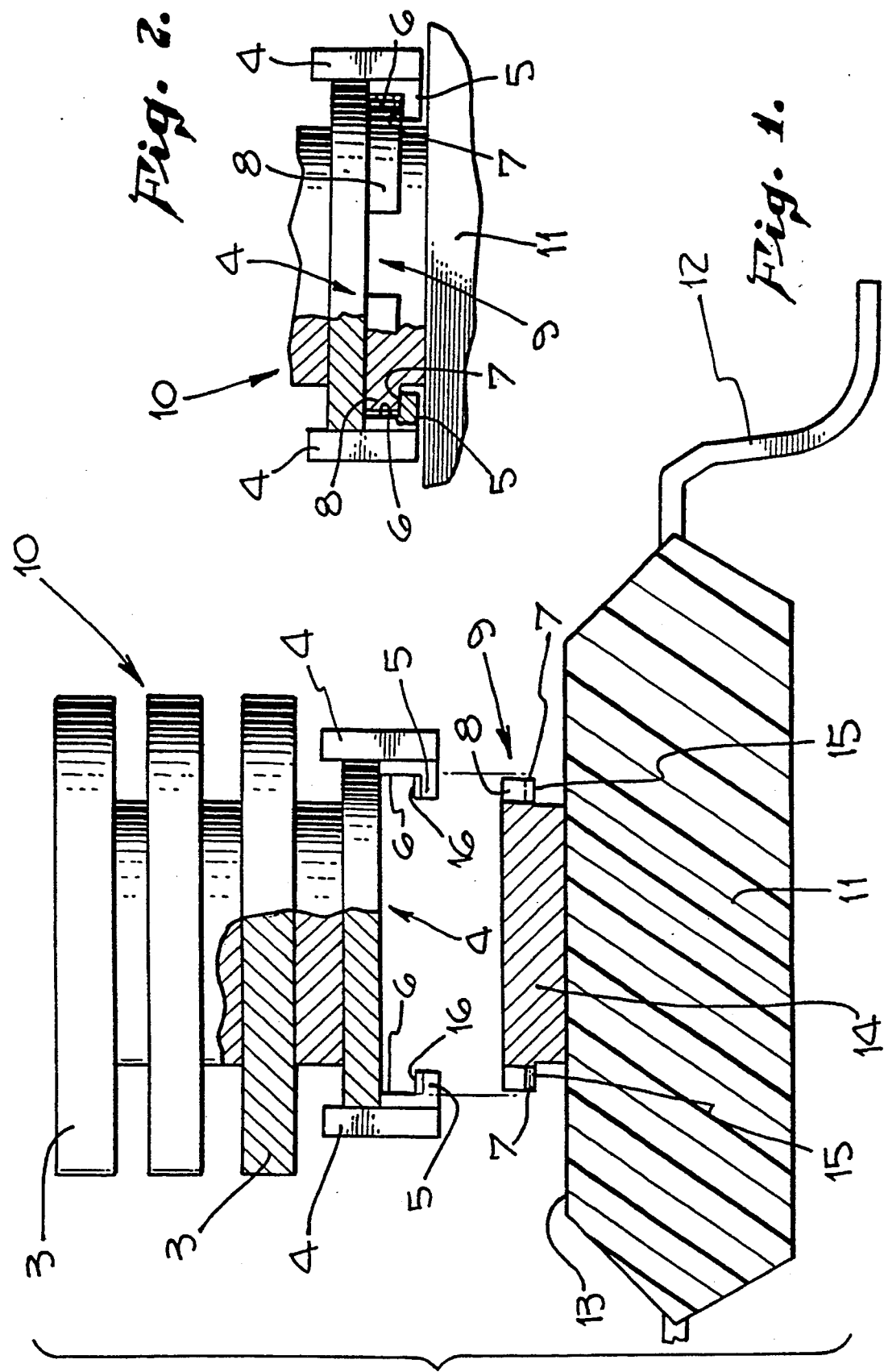

HIGH POWER DISSIPATING PACKAGES WITH MATCHED HEATSPREADER HEATSINK ASSEMBLIES

This is a continuation application of Ser. No. 08/023,981, filed Feb. 26, 1993.

BACKGROUND OF THE INVENTION

1. Field of the Invention

The present invention relates to a heatsink for dissipating heat from integrated circuits or other electronic devices and, more particularly, relates to a removable heatsink capable for providing varying amounts of power dissipation.

2. Description of Related Art

Heatsinks are important components in integrated circuits and other electronic packaged devices which consume power and generate heat. The heatsink draws heat away from the electronic device it is attached to and dissipates the heat into the surrounding environment. Typically, the heatsink will be affixed to an electronic device at the package level. For example, in the case of an integrated circuit, the heatsink is usually attached when the integrated circuit is coated with plastic, metal, ceramic, or otherwise packaged. In the remaining discussion and throughout this specification, integrated circuits will be referred to as exemplary electronic devices to which the present invention relates. However, it should be understood that the discussion also applies to other types of packaged electronic devices.

An integrated circuit should employ a heatsink capable of dissipating the heat that is generated when the integrated circuit is operating at maximum power consumption. Such heatsinks, however, are larger than they might otherwise be since a particular board application for an integrated circuit might generate less heat than the same integrated circuit would generate when operating at maximum power. Attaching a heatsink at the package level is therefore inflexible and inefficient in that the size of the heatsink cannot be tailored to the needs of a particular application. Furthermore, installing the heatsink prior to production of circuit boards or other devices which incorporate integrated circuits may needlessly increase the cost of the devices as well as make them more difficult to handle and process. Permanent heatsink attachment methods using glue or epoxy require additional curing steps and cannot be readily removed after attachment.

The above problems with conventional heatsinks have created a need for removable heatsinks so that different sized heatsinks can be quickly and conveniently applied to integrated circuits as appropriate to a particular application. Various removable heatsinks exist in the prior art. U.S. Pat. No. 4,716,494, issued to Bright et al., discloses a retention system for a removable heatsink using a spring clip. Moreover, the clip is cumbersome, adds additional weight to the integrated circuit, and requires special adoptive retention projections which must be carefully aligned on the integrated circuit. The clip also has practical drawbacks of taking up unnecessary space and potentially leading to damage of the integrated circuit due to excessive force exerted by the spring.

U.S. Pat. No. 4,729,426, issued to Hinshaw, discloses a bonded clip heatsink incorporating a clip of resilient material which is bonded to the heatsink body and adopted to grip the electronic device packaged to secure the electronic device. The clip is cumbersome, takes up unnecessary space and is not truly removable.

U.S. Pat. No. 4,978,638, issued to Buller et al., discloses a method for attaching a heatsink to a plastic package integrated circuit. However, Buller requires the additional step of gluing the heatsink or its mount onto the package. The method disclosed therein is not readily adaptable to other types of electronic device packages, since the mounting means must have a certain amount of resiliency in order for the heatsink to be snapped into place. In addition, the contact between the heat sink and the package is not maintained through the application of downward force, but instead the heatsink is held in place via lateral force.

U.S. Pat. No. 4,712,159, issued to Clemens, discloses a heatsink clip assembly which requires an additional clip and end locking prongs. This assembly is cumbersome, requires unnecessary additional parts and is not easily removable. Furthermore, a non-removable prong platform disposed beneath the integrated circuit is required. All of the above described patents have attendant disadvantages in that they either are not easily removable or require clipping methods which add bulk and unnecessary weight and are therefore not convenient to use within the very tight tolerances of a modern printed circuit board.

As is apparent from the above, there presently is a need for a removable heatsink and heatspreader assembly in which the heatsink can be easily and conveniently removed from the heatspreader. The removable heatsink should permit matching of a desired size and type of heatsink to the performance characteristics of an integrated circuit used in a particular application. The removable heatsink should be easily removable and yet require no additional clips or other parts. Furthermore, the removable heatsink should not violate circuit board tolerance restrictions by taking up additional space on the board, yet should be readily adaptable for use with a wide variety of electronic device packages.

SUMMARY OF THE INVENTION

The present invention provides a removable heatsink which overcomes the above identified problems in the prior art. The heatsink assembly of the present invention is comprised of a heatsink and a heatspreader. The heatsink is comprised of at least one fin portion for radiating heat away from a packaged electronic device and a radiation portion to which the fin portion is attached. The radiation portion includes a coupling portion which has a collar. The heatspreader is in thermal contact with an electronic device package and comprises a platform portion and tab portions. The collar portion of the heatsink is designed so as to mate with the tab portions of the heatspreader. When the collar portion of the heatsink is aligned with the tab portions of the heatspreader, the heatsink is turned and the collar of the heatsink engages the heatspreader.

In accordance with one aspect of the present invention, the heatspreader includes spring loaded balls which exert a downward force on the collar portion of the heatsink when the heatsink is engaged to the heatspreader. In this manner, a strong thermal contact is maintained between the heatspreader and the heatsink as long as the two are engaged. Heat is therefore efficiently transferred from the electronic device package through the heatspreader into the heatsink where it can be effectively dissipated.

As a feature of the present invention, the heatsink is easily removable from the heatspreader and electronic device package. The heatsink thus provides the capability of selecting the optimal size and style of heatsink for a particular application. The additional assembly steps and inflexibility associated with permanently attached heatsinks is thereby avoided. In addition, the present invention eliminates the additional parts and cumbersome removal associated with the currently available removable heatsinks.

As another feature of the present invention, the heatsink extends only in an upward direction from the electronic device package, and does not include any elements which extend around the sides of the device. The heatsink of the present invention thus does not create any tolerance problems when used with devices which are assembled onto a densely packed circuit board. The danger of inadvertent and potentially damaging contact of the heatsink with the device leads during installation is also greatly reduced.

As an additional feature of the present invention, the heatsink provides a strong thermal contact with the underlying electronic device package without exerting force on the package itself, and without sacrificing ease in removal. By incorporating the force generating elements which hold the heatsink in contact with the heatspreader into the heatspreader itself, a suitable force is maintained without exerting undue stress on the package.

As a further feature of the present invention, the heatspreader may be incorporated into a wide variety of electronic device packages regardless of package size, shape or construction material. Since any type of heatsink can be easily attached to the component package using the heatspreader, the present invention can provide a standard for heatsink mounting hardware that will permit a high degree of interchangeability and design flexibility in electronic device manufacture. Instead of designing a device around a particular heatsink, electronic package designers can incorporate the heatspreader of the present invention knowing that users will have the flexibility to choose the proper heatsink during production. Electronic devices will therefore be more readily interchanged from one application to another, and duplicated heatsink design efforts with be significantly reduced.

The above-discussed features and attendant advantages of the present invention will become better understood by reference to the following detailed description of the preferred embodiments and the accompanying drawings.

BRIEF DESCRIPTION OF THE DRAWINGS

FIG. 1 is a cross-sectional exploded view of an exemplary heatsink and a heatspreader which comprise the heatsink assembly of the present invention.

FIG. 2 is a perspective view illustrating the removable engagement of the heatsink and heatspreader of FIG. 1.

DETAILED DESCRIPTION OF THE PREFERRED EMBODIMENTS

Figure 3:
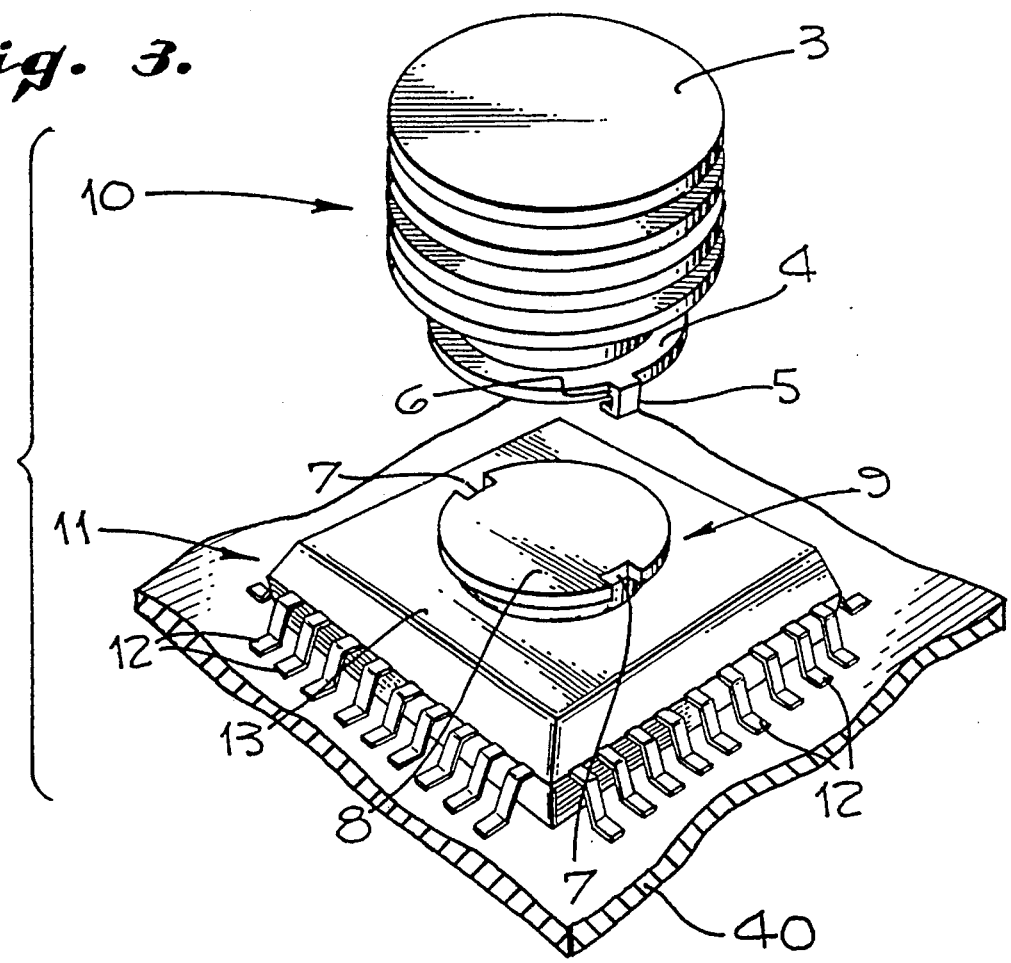
FIG. 3 is an exploded view of an alternative embodiment of the present invention.

The present invention provides a removable heatsink which can be quickly and easily detached from a heatspreader attached to an electronic device package. The following detailed description describes exemplary embodiments of the present invention as applied to integrated circuit packages. It should be understood, however, that the present invention may also be applied to any other electronic package which dissipates power and thereby generates heat. Furthermore, an almost unlimited variety of heatsinks may be used in accordance with the present invention. The exact size and shape of the heatsink can be tailored to fit the needs of a particular application without deviating from the principles of the present invention.

The exemplary embodiment of FIG. 1 illustrates the basic operation of the present invention as applied to an exemplary integrated circuit package. The heatsink assembly is comprised of a heatsink unit 10 and a heatspreader 9. The heatspreader 9 is in thermal contact with an electronic device package 11 having a plurality of external leads 12. In the case of an integrated circuit, the leads 12 are part of a lead frame contained within the package 11. The heatspreader 9 is typically comprised of copper. The superior heat dissipation properties of that metal effectively draw the heat out of the integrated circuit package 11. Alternatively, other heat conductive materials could also be used. The package 11 can be of plastic, ceramic or other material commonly used in the art. The removable heatsink unit 10 has a plurality of radiating fins 3 and a coupling collar 4. The upper portions of the heatsink unit 10 is usually constructed of aluminum in order to conserve weight, but other conductive materials may also be suitable. Fins 3 are typically comprised of an aluminum and not copper, in view of the lightness of aluminum and also in view of the fact that a larger surface area permits additional space for dissipation of heat. The coupling collar 4 and flanges 5 should be constructed of a material such as copper with good heat conduction properties in order to facilitate the transfer of heat from the heatspreader 9 to the heatsink unit 10.

Coupling collar 4 includes flanges 5 having ramp-like inner coupling grooves 6. The flanges 5 are adapted to be secured to ramp-like generally circumferential tabs 7 which are disposed generally under platform 8 of heatspreader 9. The tabs are spaced a predetermined distance above the upper surface 13 of package 11. The tabs 7 are adjacent the periphery of the platform 8 of heatspreader 9. In the present embodiment, inner collar portion 14 extends into the package 11 and is attached to a lead frame within the integrated circuit package by means of a nonconductive glue or tape, as will be appreciated by those knowledgeable in integrated circuit packaging.

Figure 5:
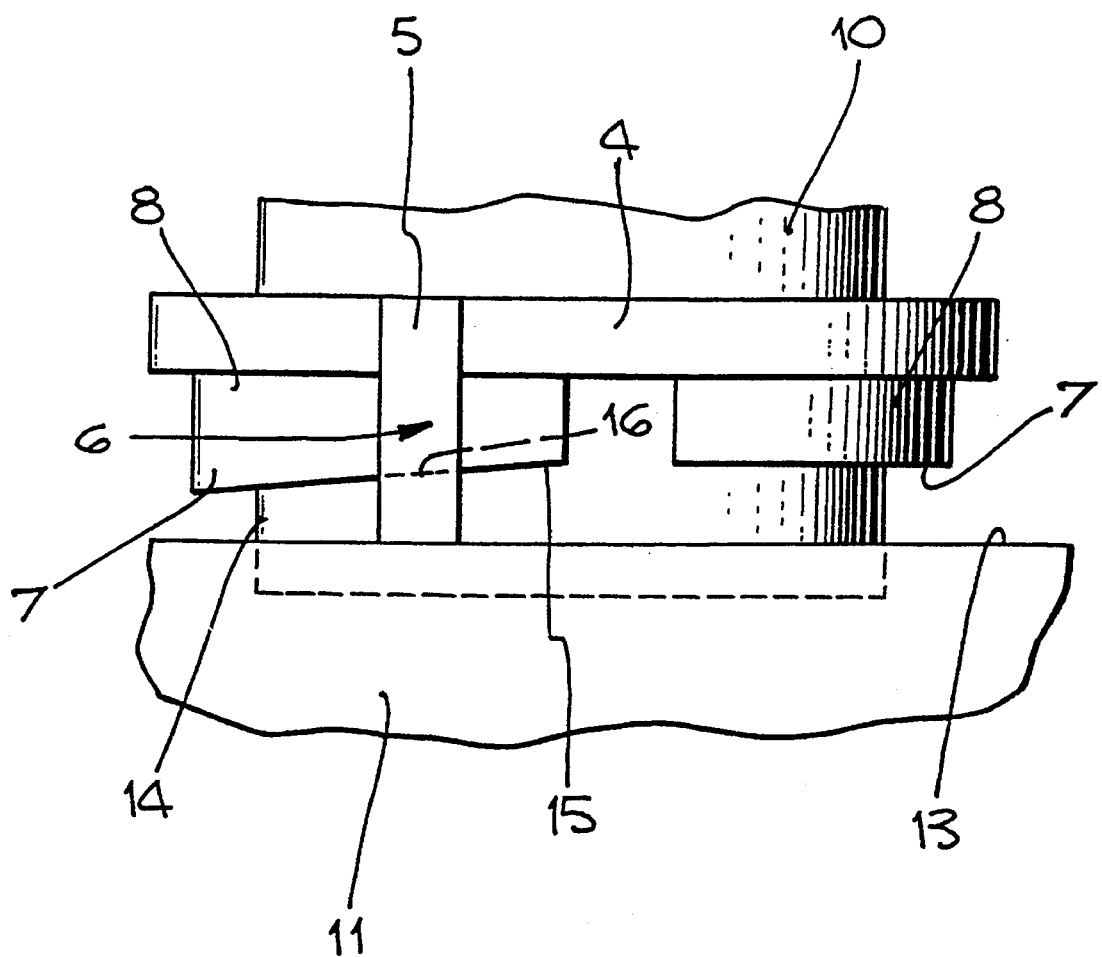
FIG. 5 is a side elevation illustrating how the heatsink and heatspreader of FIGS. 1 and 2 are removably coupled together.

The heatsink unit 10 and heatspreader 9 are shown in engagement in FIG. 2. Inner coupling grooves 6 are adapted to slidably engage collar platform 8 of heatspreader 9 via tabs 7. Ramp-like coupling grooves 6 are tapered to engage tabs 7 such that heatsink unit 10 can be removably coupled to platform 8 of heatspreader 9 by disposing coupling collar 4 onto collar platform 8 and turning heatsink unit 10 onto collar platform 8 and thereby into frictional engagement therewith. Ramp-like coupling grooves 6 tighten about platform 8 as the heatsink unit 10 is turned. More specifically, as illustrated in FIG. 5, the lower surfaces of the tabs 7 are formed with ramps 15 which engage with ramps 16 formed on the upper surfaces of the flanges 5.

An exploded perspective view of a preferred embodiment of the present invention is shown in FIG. 3. The details of the integrated circuit package and heatsink assembly are as described in connection with FIGS. 1 and 2 above. The heatsink unit 10 is illustrated as being operatively mounted on a printed circuit board 40. By reference to FIG. 3 the manner in which flanges 5 and grooves 6 fit into tabs 7 and thereby engage platform 8 is readily apparent.

Figure 4:
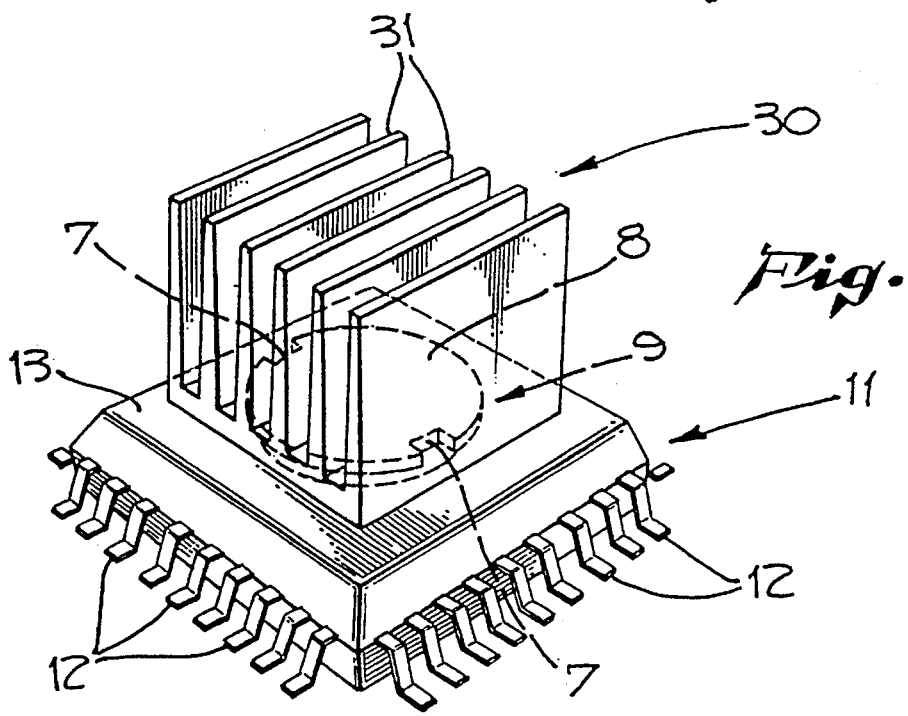
FIG. 4 is a perspective view of an alternative embodiment of the present invention incorporating a square fin heatsink.

As was previously mentioned, heatsink unit 10 is not limited to horizontal circular radiating fins 3 as shown in FIGS. 1, 2 and 3 but could instead include a wide variety of other heatsink sizes and shapes, depending upon the requirements of a particular application. An exemplary alternative heatsink unit 30 is shown in FIG. 4. Heatsink unit 30 includes a plurality of square vertically placed fins 31. It should be noted that the heatspreader 9 is unchanged from the previous embodiment. Heatsink unit 30 will include a coupling collar, flanges and grooves similar to those discussed above in order to engage platform 8 of heatspreader 9 via tabs 7. This is illustrative of the interchangeability of heatsink capability which is provided by the present invention. The concepts of the present invention thus include all types of radiating surface areas that can be employed embodying the above described concepts of the present invention.

The above described particular embodiments of the present invention allow the heatspreader 9 and integrated circuit package 11 to be assembled at the packaging stage of operations and the heatsink unit 10 thus need not be assembled onto heatspreader 9 until after the integrated circuit has been packaged and the precise operating environment for the integrated circuit or other electronic device has been determined. If a particular integrated circuit application demands only a portion of the maximum power consumption of the integrated circuit a smaller heatsink could be used than that required when the same integrated circuit performs at maximum power levels. For example, an integrated circuit operating at lower power levels might include only a single fin. The exact heatsink surface area required will depend upon the amount of power dissipated within the device to which it is attached.

The above invention thus provides a removable heatsink which need not be attached at the packaging stage and yet requires no additional cumbersome clips or other fastening devices to attach the heatsink unit to the heatspreader. The proper heatsink can be precisely tailored to fit the intended use of a particular integrated circuit or other electronic device and therefore prevents the unnecessary waste of additional aluminum or other metal which might otherwise be part of a heatsink designed to accommodate maximum power dissipation requirements for a particular device. This contributes to efficient layout and manufacture of circuit boards.

It will be understood by those skilled in the art that the above description is by way of example only and that many alternate implementations of this method are possible without deviating from the scope of the invention, which is limited only by the appended claims. For example, although not specifically illustrated, the ramps 15 on the tabs 7 can be replaced by spring loaded balls or other means for exerting a downward force on the flanges 5 of the heatsink 10 and maintaining the heatsink 10 firmly attached to the heatspreader 9.

What is claimed is:

1. An electronic assembly, comprising:
   a packaged electronic device; and
   a heatsink assembly for radiating heat away from said device, including:
   a removable heatsink unit having at least one fin and a coupling collar;
   a heatspreader having a platform, at least one tab and an inner collar, said platform being attached to said inner collar and said tab being disposed along the periphery of said platform, said heatspreader adapted to be in thermal contact with the packaged electronic device and adapted to receive a portion of said coupling collar of said heatsink unit within said tab such that when said heatsink unit is turned, said coupling collar removably engages said platform of said heatspreader, thereby removably coupling said heatsink unit to said heatspreader.

2. The electronic assembly of claim 1 wherein said electronic device package is comprised of a plastic material.

3. The electronic assembly of claim 1 wherein a portion of said heatspreader is adapted to be disposed within said electronic device package.

4. The electronic assembly of claim 1 wherein said coupling collar of said heatsink unit is comprised of copper.

5. The electronic assembly of claim 1 wherein said inner collar of said heatspreader is comprised of copper.

6. The electronic assembly of claim 1 wherein said fin of said heatsink unit is comprised of aluminum.

7. The electronic assembly of claim 1 wherein said coupling collar of said heatsink unit and said platform of said heatspreader are circular in shape.

8. The electronic assembly of claim 1 wherein said packaged electronic device comprises an integrated circuit.

9. The electronic assembly of claim 1, further comprising a circuit board on which said packaged electronic device is mounted.

10. The electronic assembly of claim 1 wherein said portion of said coupling collar of said heatsink unit comprises a flange having an inner coupling groove.

11. The electronic assembly of claim 10 wherein said flange engages said tab and said inner coupling groove within said flange tightens about said platform as said heatsink unit is turned while said flange engages said tab.

12. The electronic assembly of claim 10 wherein said inner coupling groove has a ramp-like surface.

13. The electronic assembly of claim 10 wherein said coupling collar includes two of said flanges, each of said flanges having an inner coupling groove, and further wherein said heatspreader includes two tabs, each of said tabs adapted for receiving one of said flanges.

14. The electronic assembly of claim 13 wherein said two flanges are arranged on opposite sides of said coupling collar and said two tabs are arranged on opposite sides of said platform.

15. A method of fabricating an electronic assembly, comprising the steps of:
   (a) providing a packaged electronic device;
   (b) providing a heatsink assembly for radiating heat away from said device, including:
      a removable heatsink unit having at least one fin and a coupling collar;
      a heatspreader having a platform, at least one tab and an inner collar, said platform being attached to said inner collar and said tab being disposed along the periphery of said platform;
   (c) attaching said heatspreader to and in thermal contact with said packaged electronic device;
   (d) inserting a portion of said coupling collar of said heatsink unit within said tab; and
   (e) turning said heatsink unit such that said coupling collar removably engages said platform of said heatspreader, thereby removably coupling said heatsink unit to said heatspreader.

16. The method of claim 15, wherein step (a) comprises providing said packaged electronic device as comprising a plastic material.

17. The method of claim 15, wherein step (c) comprises disposing a portion of said heatspreader within said electronic device package.

18. The method of claim 15, wherein step (b) comprises providing said coupling collar of said heatsink unit as comprising copper.

19. The method of claim 15, wherein step (b) comprises providing said inner collar of said heatspreader as comprising copper.

20. The method of claim 15, wherein step (b) comprises providing said fin of said heatsink unit as comprising aluminum.

21. The method of claim 15, wherein step (b) comprises providing said coupling collar of said heatsink unit and said platform of said heatspreader as being circular in shape.

22. The method of claim 15, wherein step (a) comprises providing said packaged electronic device as comprising an integrated circuit.

23. The method of claim 15, further comprising the step of:
(f) mounting said packaged electronic device on a circuit board.

24. The method of claim 15, wherein step (b) comprises providing said portion of said coupling collar of said heatsink unit as comprising a flange having an inner coupling groove.

25. The method of claim 24, wherein step (e) comprises turning said heatsink unit such that said flange engages said tab, and said inner coupling groove within said flange tightens about said platform while said flange engages said tab.

26. The method of claim 24, wherein step (b) comprises providing said inner coupling groove as having a ramp-like surface.

27. The method of claim 24, wherein step (b) comprises providing said coupling collar as including two of said flanges, each of said flanges having an inner coupling groove, and further wherein said heatspreader includes two tabs, each of said tabs adapted for receiving one of said flanges.

28. The method of claim 27, wherein step (b) comprises providing said two flanges as being arranged on opposite sides of said coupling collar and said two tabs are arranged on opposite sides of said platform.

* * * * *